United States Patent
Moench et al.

(10) Patent No.: US 10,181,701 B2
(45) Date of Patent: Jan. 15, 2019

(54) SAFE LASER DEVICE FOR OPTICAL SENSING APPLICATIONS

(71) Applicant: KONINKLIJKE PHILIPS N.V., Eindhoven (NL)

(72) Inventors: Holger Moench, Eindhoven (NL); Alexander Weigl, Eindhoven (NL); Philipp Henning Gerlach, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 15/563,636

(22) PCT Filed: Mar. 29, 2016

(86) PCT No.: PCT/EP2016/056752
§ 371 (c)(1),
(2) Date: Oct. 2, 2017

(87) PCT Pub. No.: WO2016/162236
PCT Pub. Date: Oct. 13, 2016

(65) Prior Publication Data
US 2018/0076598 A1 Mar. 15, 2018

(30) Foreign Application Priority Data
Apr. 10, 2015 (EP) ..................... 15163096

(51) Int. Cl.
*H01S 5/00* (2006.01)
*H01S 5/068* (2006.01)
(Continued)

(52) U.S. Cl.
CPC .......... *H01S 5/423* (2013.01); *H01S 5/02248* (2013.01); *H01S 5/06825* (2013.01);
(Continued)

(58) Field of Classification Search
CPC ............. H01S 5/18377; H01S 5/06825; H01S 5/18327; H01S 5/022; H01S 5/183; H01S 5/18355
(Continued)

(56) References Cited

U.S. PATENT DOCUMENTS 6,618,414 B1 9/2003 Wasserbauer et al.
8,961,578 B2 * 2/2015 Liu ..................... A61B 18/203
606/9
(Continued)

FOREIGN PATENT DOCUMENTS

JP 2006351797 A 12/2006
JP 2011066125 A 3/2011
(Continued)

*Primary Examiner* — Tuan Nguyen (57) ABSTRACT

The invention describes a laser device (100) comprising between two and six mesas (120) provided on one semiconductor chip (110), wherein the mesas (120) are electrically connected in parallel. The laser device (100) is adapted such that degradation of at least one mesa (120) results in a decreased laser power emitted by the laser device (100) in a defined solid angle when driven at the defined electrical input power. The laser device (100) is adapted such that eye safety of the laser device (100) is guaranteed during life time of the laser device (100). Eye safety may be guaranteed by designing the semiconductor structure or more general layer structure of mesas (120) of the laser device (100) in a way that degradation of one or more layers of the layer structure results in a reduction of the maximum optical power emitted in a defined solid angle. Alternatively or in addition, the electrical input power supplied to the laser device (100) may be controlled and adapted depending on the emitted optical power such that safety limits are not exceeded. The invention further relates to a laser module and an optical sensor (300) comprising such a laser device (100) and mobile communication device (400) comprising such an optical sensor (300). The invention further relates to a method of manufacturing such a laser device (100).

17 Claims, 5 Drawing Sheets

(51) Int. Cl.
  *H01S 5/42* (2006.01)
  *H01S 5/022* (2006.01)
  *H01S 5/028* (2006.01)
  *H01S 5/183* (2006.01)

(52) U.S. Cl.
  CPC ...... *H01S 5/18327* (2013.01); *H01S 5/18358* (2013.01); *H01S 5/0282* (2013.01); *H01S 5/18361* (2013.01); *H01S 5/18377* (2013.01); *H01S 5/18391* (2013.01)

(58) Field of Classification Search
  USPC .......................................... 372/50.12; 438/31
  See application file for complete search history.

(56) References Cited

U.S. PATENT DOCUMENTS

| | | |
|---|---|---|
| 2002/0071463 A1 | 6/2002 | Garnach et al. |
| 2002/0075911 A1 | 6/2002 | Cham et al. |
| 2009/0097522 A1 | 4/2009 | Justice et al. |
| 2013/0266326 A1 | 10/2013 | Joseph et al. |

FOREIGN PATENT DOCUMENTS

| | | |
|---|---|---|
| JP | 2014017448 A | 1/2014 |
| WO | 2015055600 A1 | 4/2015 |

\* cited by examiner

SAFE LASER DEVICE FOR OPTICAL SENSING APPLICATIONS

CROSS-REFRENCE TO PRIOR APPLICATIONS

This application is the U.S. National Phase application under 35 U.S.C. § 371 of International Application No. PCT/EP2016/056752, filed on Mar. 29, 2016 which claims the benefit of EP Patent Application No. EP 15163096.9, filed on Apr. 10, 2015. These applications are hereby incorporated by reference herein.

FIELD OF THE INVENTION

The invention relates to a laser device wherein the laser device is especially suited for sensing applications. The invention further relates to a laser module and an optical sensor comprising such a laser device and mobile communication device comprising such an optical sensor. The invention further relates to a method of manufacturing such a laser device.

BACKGROUND OF THE INVENTION

Laser devices may be used within mobile communication devices as smartphones for sensing applications. Such sensing applications may be time of flight measurements for distance detection, camera autofocus, 3-D imaging of a scene or a gesture based user interface. Eye safety of such laser devices may be a major issue for broad acceptance of such sensing applications.

US 2013/0266326 A1 discloses a multibeam optoelectronic device, referred to as a VCSEL array device, which has high power and a high frequency response and various microlens structures that may be formed thereon, as well as various methods for utilization of the same. The VCSEL array device is a monolithic array of VCSELs comprised of two or more VCSELs and an array of short-circuited mesa devices. The VCSELs of the VCSEL array can be spaced symmetrically or asymmetrically, spaced according to a mathematical function for improving a power or speed characteristic, or positioned for phase relationships next to each other in an electrically parallel circuit. The VCSELs of the VCSEL array are electrically connected to a first metal contact pad formed on a heat-spreading substrate or carrier.

US 2002/0075911 A1 discloses a diffractive optical arrangement (DOA) that is configured to diffract a portion of an input beam of every vertical cavity surface emitting laser (VCSEL) in a parallel channel optical array, so that all of the VCSELs can be monitored simultaneously. For every channel in the array, there is a detector for monitoring the optical power output of the associated VCSEL and a feedback system for adjusting the input current. The DOA comprises a collimating beam input region on one side, a beam output region on the opposite side, and a detection output region. The DOA is configured to pass a first portion of a beam from the collimating beam input region to the beam output region for data transmissions and to diffract a second portion from the collimating beam input region to the detection output region for monitoring. The collimating beam input region includes a diffractive feature, which may be that of a computer generated hologram (CGH) or may be a grating.

U.S. Pat. No. 6,618,414 B1 discloses a vertical cavity laser which includes an optical cavity adjacent to a first mirror, the optical cavity having a semiconductor portion and a dielectric spacer layer. A dielectric DBR is deposited adjacent to the dielectric spacer layer. The interface between the semiconductor portion of the optical cavity and the dielectric spacer layer is advantageously located at or near a null in the optical standing wave intensity pattern of the vertical cavity laser to reduce the losses or scattering associated with that interface.

SUMMARY OF THE INVENTION

It's thus an object of the present invention to provide a laser device with improved laser safety.

According to a first aspect a laser device is proposed. The laser device comprises between two and six mesas provided on one semiconductor chip. The mesas are electrically connected in parallel such that the mesas are adapted to emit laser light at the same time if a defined electrical input power is provided to the mesas. The laser device is further adapted such that degradation of at least one mesa results in a decreased laser power emitted by the laser device in a defined solid angle when driven at the defined electrical input power such that eye safety of the laser device is maintained.

Laser cavities of the laser devices comprise an active layer which is sandwiched between two mirrors such as Distributed Bragg Reflectors (DBRs). A first mirror is highly reflective (>99%) and a second mirror does have a somewhat smaller reflectivity (>95%) in order to enable laser emission. The reflectivity of the second mirror, for example, influences the laser threshold and the slope of the laser power with respect to the electrical input power. A reduced reflectivity of the second mirror increases the laser threshold and increases the slope and vice versa. Increased laser threshold reduces the optical power which is emitted at a given electrical input power wherein an increased slope increases the optical power at the given electrical input power. Experimental results have, for example, shown that including the typical spread in production processes there seem to be a number of factors influencing the emitted optical power at a given electrical input power such that there is a high likelihood that the emitted optical power increases when the reflectivity of the second mirror reduces (e.g. by degradation). Furthermore, the need for larger sensing distances and a good differentiation from environmental light for sensing applications like time of flight measurements increases the desire for an as high as possible emitted laser power. The latter results in a design of laser devices providing as much laser power as possible as long as the laser power is below a laser safety threshold or safety limit. Degradation of the reflectivity of the second mirror may thus result in a transgression of the safety limits in certain solid angles of the emission cone of the laser light. Furthermore, degradation of one of the layers of the mesas of the laser device may influence the mode selection within the respective laser cavity such that the brightness of laser light emitted in certain solid angles may increase.

The laser device is therefore adapted such that degradation of at least one mesa results in a decreased laser power emitted by the laser device in a defined solid angle and preferably in an overall reduced laser power when driven at the defined electrical input power. The defined solid angle is the solid angle in which maximum laser power is emitted, wherein the size of the solid angle is determined in view of eye safety of the laser device. It may be that the laser power emitted in this defined solid angle reduces, for example, because the mode selection within one of the laser cavities changes but the overall laser power slightly increases. The safety limits may in this case not be exceeded because an eye of a human being can only receive light emitted in limited solid angle. Eye safety of the laser device is thus maintained despite of the fact that the total laser power emitted by the laser device increases. The laser device may have, for example, to fulfill the condition that the maximum optical power at a distance of 70 mm measured behind an aperture with a diameter of 7 mm is below a defined threshold at any position of the aperture at this distance. Due to the multimode nature of lasers as, for example, Vertical Cavity Surface Emitting Lasers (VCSEL) the maximum power may not be emitted along the optical axis of the laser. The defined solid angle has thus to be determined by means of a scan with the aperture of 7 mm at the distance of 70 mm. Such a measurement is in accordance with the standard IEC/EN: 60825-1:2007 which is incorporated by reference.

Each mesa of the laser device may comprise a semiconductor air interface. The semiconductor air interface may be the upper layer of the DBR through which laser light is emitted. The semiconductor air interface may also be a surface of a semiconductor layer which is covered by means of another layer such that initially there is no direct contact between this semiconductor layer and air. The semiconductor air interface may in this case be a result of a defect of the layer covering the semiconductor layer. The laser device is adapted such that degradation of at least one semiconductor air interface of one mesa results in a decreased laser power emitted by the laser device when driven at the defined electrical input power.

The semiconductor air interface may, for example, be arranged in a node of a standing wave pattern when driven at the defined electrical input power. Laser devices as, for example, Vertical Cavity Surface Emitting Lasers (VCSEL) are designed with the semiconductor air interface in an anti-node in order to have a maximum contribution to the reflectivity and in consequence less DBR layers. Designing the semiconductor air interface in a node of the standing wave pattern of the optical field in the laser cavity or at least sufficiently distant from the anti-node may result in a decreased laser power emitted by the laser device in the defined solid angle when driven at the defined electrical input power. In this case a degradation of the air interface would increase the reflectivity i.e. reduce the out-coupling and less laser power would be emitted. Furthermore, due to the functional relation between reflectivity and angle of incidence the "node-position" of the semiconductor air interface maximizes the outcoupling for lower order modes with small emission angle. A degradation of such layer would therefore increase the emission angle which is favorable in order to keep the laser device safe by reducing the laser power emitted in the defined solid angle.

Each mesa may alternatively or in addition comprise a protective coating, wherein the protective coating is adapted such that degradation of at least one protective coating of one mesa results in a decreased laser power emitted by the laser device when driven at the defined electrical input power.

The protective coating may comprise one or more layers of silicon oxide or silicon nitride preferably a combination of both in order to ensure that pinhole defects which may occur with one composition do not translate to the outside. The thickness is typically a few 10-100 nm, preferably a well defined fraction of the wavelength e.g. half lambda or quarter lambda. Alternatively or in addition, oxides of other materials like, for example, Titanium, Tantalum or Niobium may be used as protective coatings. The protective coating may comprise a thick dichroic multilayer coating which does not only act as protective encapsulation but adds to the reflectivity of the semiconductor DBR which in turn could be designed thinner. The protective coating is water tight in order to inhibit degradation of covered semiconductor layers.

The protective coating may, for example, be arranged such that the semiconductor layer (e.g. upper layer of the out-coupling DBR) is arranged in the node position or near to the node position of the standing wave pattern of the optical field when driven at the defined electrical input power as described above. The protective coating would in this case preferably have a thickness of half of the emission wavelength such that the protective coating and the degradation of the coating does not influence the reflectivity.

Alternatively, the protective coating may be arranged such that reflectivity of the mirror covered by means of the protective coating is at least slightly reduced. Degradation of the protective coating would result in an increased reflectivity such that the out-coupled laser light emitted at the defined electrical input power reduces. The semiconductor layer (e.g. upper layer of the out-coupling DBR) is arranged in the anti-node position or near to the anti-node position of the standing wave pattern of the optical field when driven at the defined electrical input power and the protective coating is arranged that the reflectivity of the out-coupling DBR is reduced. Degradation of the protective coating will then increase reflectivity and lower the laser output. The protective coating may further comprise a spatial structure, for example, regular patterns supporting a defined mode selection within the laser cavities. The laser modes suppressed by the protective coating are arranged such that degradation of the protective coating and the corresponding spatial structure changes the laser modes such that the peak laser power emitted by the laser device within the defined solid angle is reduced.

The laser device may be further adapted such that an emission cone of laser light emitted by the laser device is increased in case of a degradation of at least one mesa when driven at the defined electrical input power. The mesas may, for example, be arranged such that ring shaped laser modes are supported in case of a degradation of a mesa when driven at the defined electrical input power. The semiconductor layer structure of the mesas may, for example, be arranged such that a ring-shaped current injection is supported in case of a degradation of a mesa when driven at the defined electrical input power. Ring shaped laser modes reduce optical power emitted in the defined solid angle.

The laser device according to a further embodiment comprises between two and six mesas provided on one semiconductor chip. The mesas are electrically connected in parallel such that the mesas are adapted to emit laser light at the same time if a defined electrical input power is provided to the mesas. The laser device is further adapted such that degradation of at least one mesa results in a decreased laser power emitted by the laser device in a defined solid angle when driven at the defined electrical input power such that eye safety of the laser device is maintained. The laser device may optionally be adapted such that an emission cone of laser light emitted by the laser device is increased in case of a degradation of at least one mesa when driven at the defined electrical input power. The mesas may alternatively or in addition be arranged such that ring shaped laser modes are supported when driven at the defined electrical input power. A semiconductor layer structure of the mesas may be optionally arranged such that there is a ring shaped current injection when driven at the defined electrical input power. Each mesa may alternatively or in addition comprise a spatially structured protective coating, wherein the spatially structured protective coating supports ring shaped laser modes when driven at the defined electrical input power.

According to a second aspect a laser device is proposed. The laser device comprises between two and six mesas provided on one semiconductor chip. The mesas are electrically connected in parallel such that the mesas are adapted to emit laser light at the same time if a defined electrical input power is provided to the mesas. The mesas comprise low doped p-DBRs with a doping concentration of about 1E18, or short DBRs in combination with a dichroic mirror, both in combination with relatively low doped cap/sub-cap structures (<1E19) lead to a ring shaped current injection. This favors ring shaped modes and therefore broadens the emission. The structure of the mesa may be combined with each measure as described above with respect to the first aspect.

According to a third aspect a laser device is proposed. The laser device comprises between two and six mesas provided on one semiconductor chip. The mesas are electrically connected in parallel such that the mesas are adapted to emit laser light at the same time if a defined electrical input power is provided to the mesas. Each mesa may comprise a spatially structured protective coating, wherein the spatially structured protective coating supports ring shaped laser modes when driven at the defined electrical input power. The spatially structured protective coating or cap layer can select desired modes. A height difference of a few 10 nm is sufficient to change the phase condition for the out-coupling mirror and therefore the reflectivity for individual modes having more or less overlap with the structured section. As an example a ring shaped shallow etch of the cap layer in the order of a few 10 nm can distinguish between a preferred operation in fundamental mode (if the phase condition is optimum for the central part) or a ring mode (for the outer part being optimum for highest reflectivity). The spatially structured protective coating of the mesa may be combined with each measure as described above with respect to the first or second aspect.

In general especially the spatially structured protective layer and the ring shaped current injection described above define the mode selection within the laser cavity by design. This design makes the laser device less sensitive to small fluctuations in production or changes during life. This could be quantitatively described by a number of n-modes contributing to the laser emission with additional modes being suppressed by a minimum value (either a dB value in mode suppression or a difference in laser threshold). The laser device may, for example, be characterized by the emission of 3, 4, 5 or more modes at the laser threshold. The suppressed modes start to lapse at, at least between 1.2 and 1.5 times higher current than the typical operating current of the laser device.

According to a fourth aspect a laser device is proposed. The laser device comprises between two and six mesas provided on one semiconductor chip. The mesas are electrically connected in parallel such that the mesas are adapted to emit laser light at the same time if a defined electrical input power is provided to the mesas. Each mesa is surrounded by a trench such that a level of the semiconductor chip beyond the trench is at least as high as the laser exit window of the mesas. The trench may be combined with each measure as described above with respect to the first, second or third aspect. Most of the semiconductor chip area remains un-etched and therefore at the original level. Passivation and contact deposition may result in large areas of the semiconductor chip on the same or even higher level than the sensitive laser facet of the mesas of the laser device.

In addition to the higher mechanical robustness of the laser device there is another advantage of such chip design in production. The much lower amount of etched material allows for a more constant etching process with a reduced influence from etch waste-products. The mesas may preferably be arranged such that the removed material is minimized. The mesas may, for example, in case of three mesas be arranged in an equilateral triangle. The distance between the mesas may be selected such that trenches of neighboring mesas overlap.

According to a fifth aspect a laser module is proposed. The laser module comprises the laser device as described above. The laser device further comprises a driving circuit for electrically driving the mesas, wherein the driving circuit is adapted to provide the defined electrical input power to the mesas.

According to a sixth aspect an optical sensor is proposed. The optical sensor comprises the laser module as described above. The optical sensor may comprise at least one photo-detector being adapted to receive reflected laser light of a corresponding laser pulse emitted by the laser device. The optical sensor may further comprise an evaluator being adapted to identify the reflected laser light of the corresponding laser pulse. The evaluator may be further adapted to determine a time of flight between a time of reception of the reflected laser light and a time of emission of the corresponding laser pulse.

Optical sensors for time of flight (ToF) measurements may be used in mobile devices (e.g. smart-phones) for many purposes like distance detection, camera autofocus, 3D imaging of a scene or a gesture based user interface. An advantageous system uses a VCSEL combined with a photodiode (e.g. avalanche photodiode) and electronics to measure the travel time of light from the VCSEL towards the scene and back to the sensor. The use of a VCSEL is advantageous compared to LED or EEL because of its stable and narrow spectral emission (allows strong filtering at the avalanche photodiode against environmental light) and because of the suitable emission pattern (rotationally symmetric with 20-30° $FW1/e^2$). Additional optics can be used to tailor the emission cone further. Multiple channels i.e. arrays of several VCSELs and/or photodiodes especially in combination with optics enable a good angular coverage. Combined with algorithms linking signals from different channels a high angular resolution can be achieved with minimum effort and especially without any moving mechanical parts like scanners. The laser devices as described above may enable long-range distance detection with increased laser safety.

The evaluator may further be adapted to determine, for example, based on a control signal emitted by the laser device the average optical power received such that the electrical input power may be reduced in order to improve laser safety. The optical power emitted by the laser device may be calibrated by means of a feedback structure with known reflectivity which is arranged near to the photo-detector and reflects a minor part of the emitted laser light. The feedback structure may, for example, be the surface of a transparent cover glass or sheet protecting the laser device of the optical sensor as well as, for example, the photo-detector. The small distance between the laser device, feedback structure and photo-detector may enable use of the detection signal emitted by the laser device as control signal. The short time between emission and reception makes it possible to differentiate between calibration and measurement signal. Alternatively, it may also be possible to use an additional control signal provided between two measurement pulses. The received signal strength of the control signal may be compared by means of the evaluator with an initial signal strength determined prior to any degradation of the laser device. The evaluator may comprise processor, microprocessor or the like and corresponding memory devices. The electrical power provided to the laser device may be reduced as soon as the received signal strengths of the calibration signal exceeds a threshold value related to the initial signal strengths.

According to a further aspect a method of manufacturing a laser device is provided. The method comprises the steps of:

providing between two and six mesas on one semiconductor chip;

electrically connecting the mesas in parallel such that the mesas emit laser light at the same time if a defined electrical input power is provided to the mesas;

adapting the laser device such that degradation of at least one mesa results in a decreased laser power emitted by the laser device when driven at the defined electrical input power.

The method steps are not necessarily performed in the presented sequence. The laser device may, for example, be adapted, in accordance with step three during the production of the layers of the mesas taking into account the technical measures described above with respect to the laser device.

It shall be understood that the laser device of claims 1-10 and the method of manufacturing the laser device according to claim 15 have similar and/or identical embodiments, in particular, as defined in the dependent claims.

It shall be understood that a preferred embodiment of the invention can also be any combination of the dependent claims with the respective independent claim.

Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings.

In the drawings.

DETAILED DESCRIPTION OF EMBODIMENTS

Various embodiments of the invention will now be described by means of the Figures.

Figure 1:
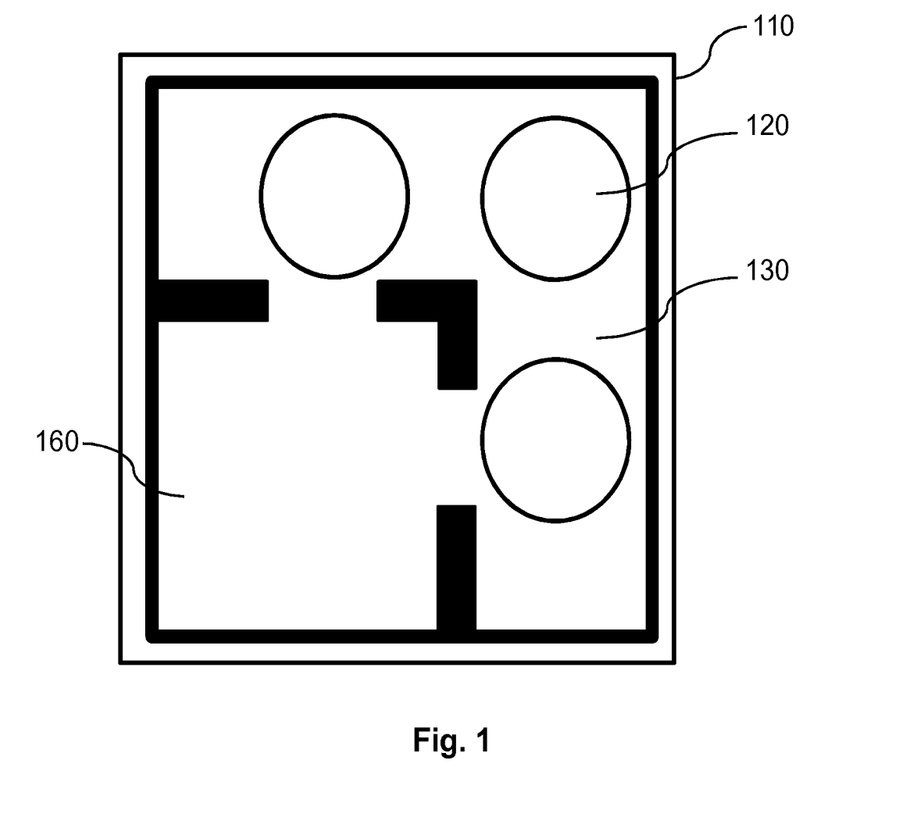
FIG. 1 shows a principal sketch of a semiconductor ship comprising three mesas
Figure 4:
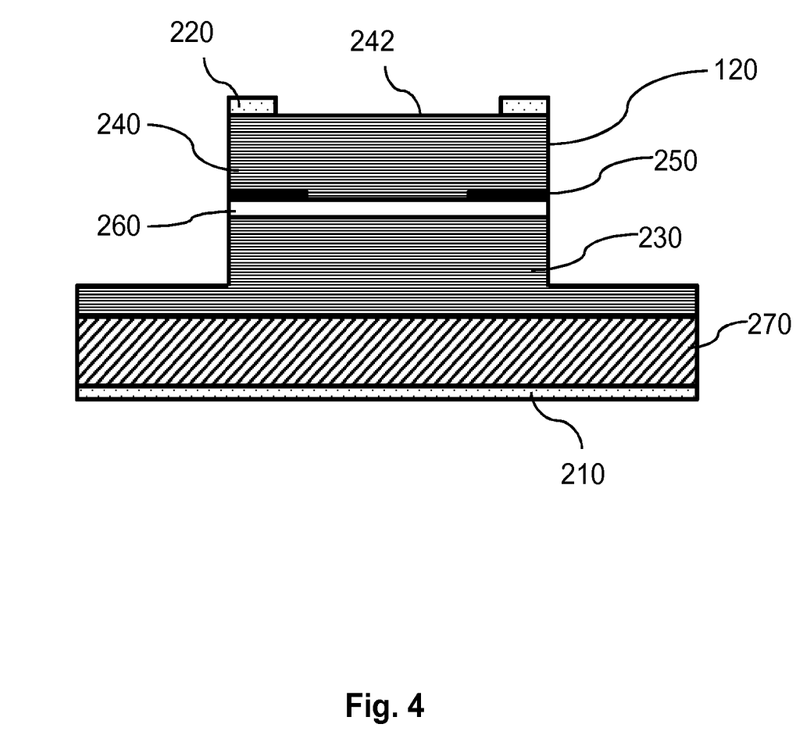
FIG. 4 shows a cross section of a VCSEL showing an optical resonator embedded in a mesa according to a first embodiment
Figure 5:
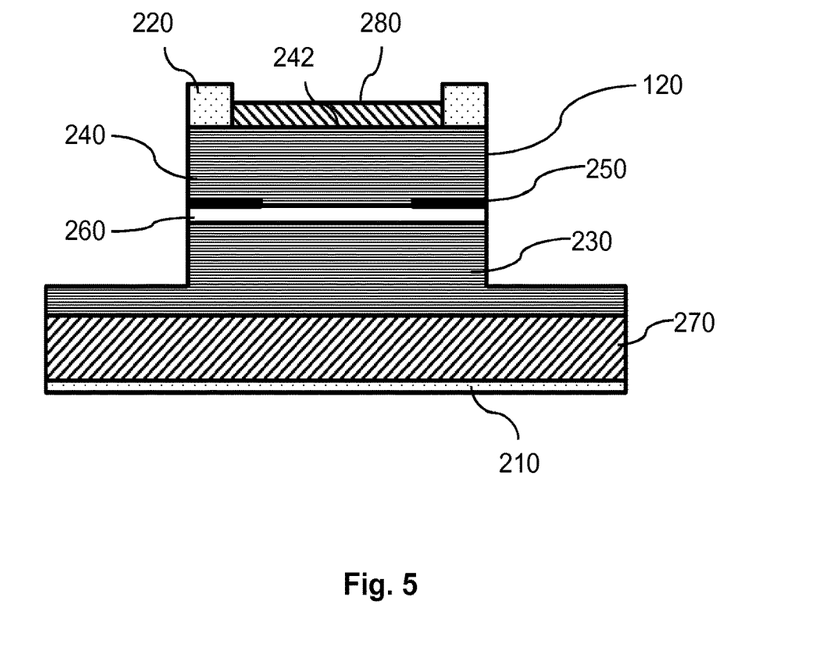
FIG. 5 shows a cross section of a VCSEL showing an optical resonator embedded in a mesa according to a second embodiment

FIG. 1 shows a principal sketch of a first embodiment of a laser device comprising a semiconductor ship 110 comprising three mesas 120. Each of the mesas comprises an optical resonator. A principal sketch of such an optical resonator is shown in FIGS. 4 and 5. A metallization layer 130 is structured such that a bonding area 160 for electrically contacting the semiconductor chip 110 of the layer device is provided.

Figure 2:
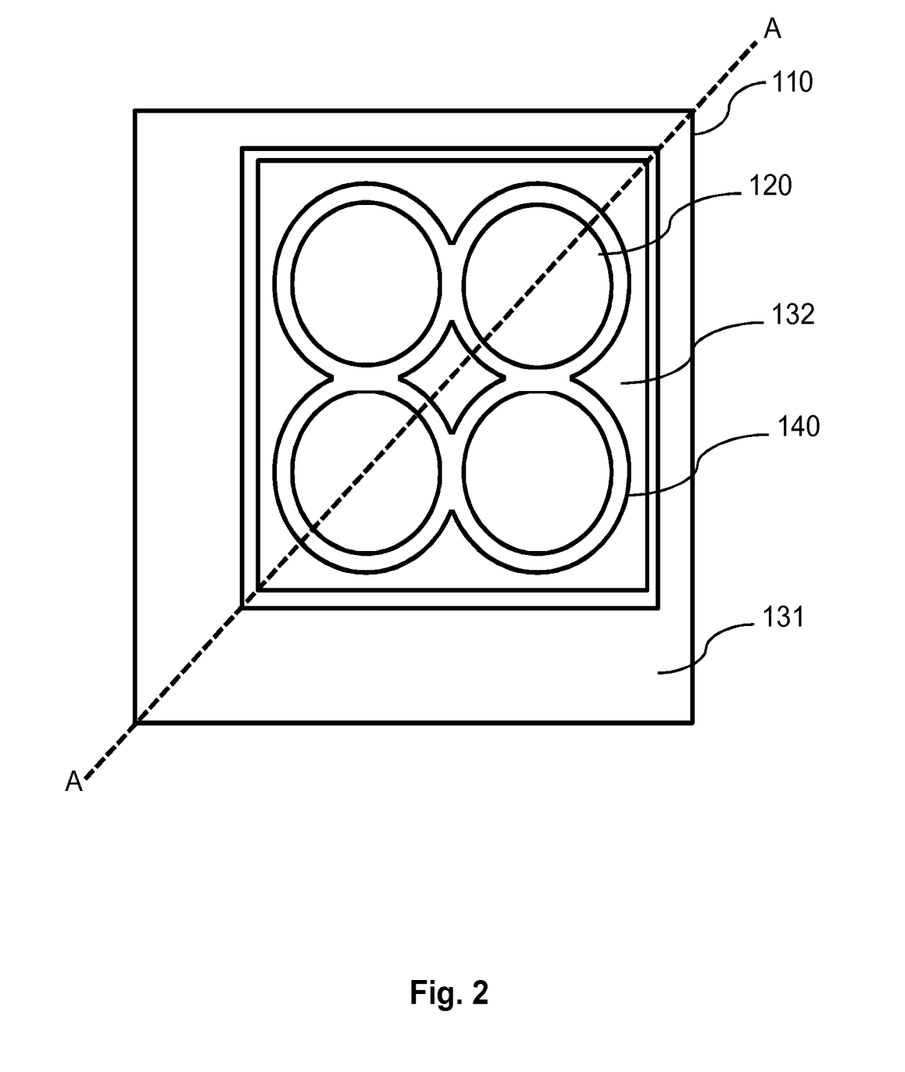
FIG. 2 shows a principal sketch of a semiconductor ship comprising four mesas

FIG. 2 shows a principal sketch of a second embodiment of a laser device comprising a semiconductor ship 110 comprising four mesas 120. The mesas are arranged in a quadratic pattern. Each mesa 120 is surrounded by a trench 140 in the layer structure of the semiconductor chip 110. The pitch between the mesas 120 and the width of the trenches 140 is chosen such that the trenches 140 between neighboring mesas 120 overlap. The material to be etched is minimized. The much lower amount of etched material allows for a more constant etching process with a reduced influence from etch waste-products. The semiconductor chip 110 further comprises a bonding area 160 and electrical contact provided at the bottom of the semiconductor chip 110 for electrically contacting the laser device with a driving circuit (see e.g. FIG. 6) for providing a defined electrical input power.

Figure 3:
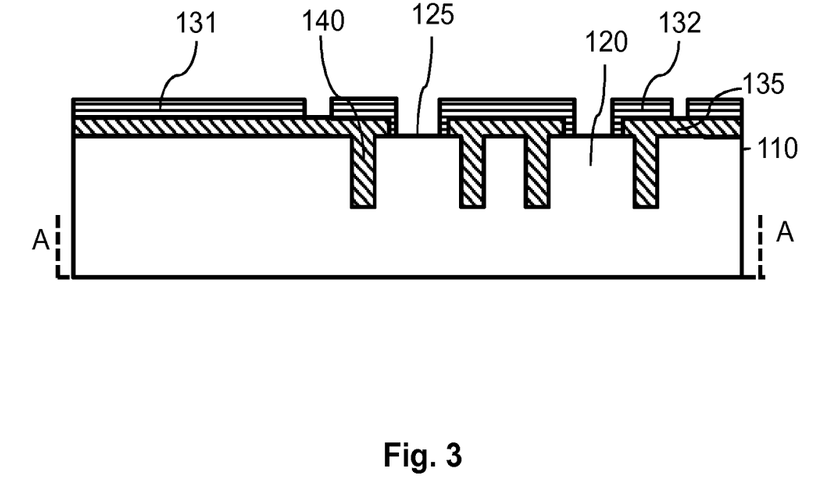
FIG. 3 shows a cross-section of the semiconductor chip shown in FIG. 2

FIG. 3 shows a cross-section of the semiconductor chip 110 shown in FIG. 2 along line A-A showing details of the trench 140 which is provided around the mesas 120. The trenches 140 are filled with electrically insulating material. On top of the electrically insulating material is a structured electrically conductive material provided building a first contact area 131 and a second contact area 132 for electrically contacting the laser device 100. The first contact area 131 is electrically connected to the p-doped layers of the mesas 120 and the second contact area is electrically connected to the n-doped layers of the mesas 120. The mesas 120 and especially the rather sensitive laser facet 125 is surrounded by a surface (top of the surface of the first and the second electrical contact areas 131, 132) which is at a higher level as the surface of the laser facet 125. This surrounding surface at a higher level simplifies handling of the semiconductor chip 110 because likelihood of touching one of the mesas 120 and especially the surface of the laser facet 125 are reduced.

FIG. 4 shows a cross section of a VCSEL showing an optical resonator embedded in a mesa 120 according to a first embodiment. The optical resonator comprises a bottom DBR 230 and a top DBR 240 and an active layer 260 sandwiched in between the bottom DBR 230 and the top DBR 240. The bottom DBR 230 is highly reflective (>99%) and the top DBR 240 does have a somewhat smaller reflectivity (>95%) in order to enable laser emission via the top DBR 240. The VCSEL is thus a so called top emitter. The active layer 260 comprises a number of layers building the Quantum Well structure. The bottom DBR 230 is arranged on a substrate like a GaAs-Substrate. The VCSEL is contacted by means of a bottom electrode 210 and a ring electrode 220. The bottom electrode 210 is provided on the side of the substrate opposite to the bottom DBR 230. The ring electrode 220 is provided on top of the top DBR 240. The first contact area 131 shown in FIGS. 2 and 3 may be used to contact the ring electrode 220 and the second contact area 132 may be used to contact the bottom electrode 210, for example, by means of a via. A confinement layer 250 is used to restrict the current flow through active area to a defined in this case circular area of the active layer. The confinement layer 250 comprises an electrically essentially nonconductive oxide area with a circular hole processed by lateral oxidization of the confinement layer 250 after etching the mesa. The confinement layer 250 is in this case arranged on top of the active layer 260. The confinement layer may also be positioned within the bottom DBR 230 or the top DBR 240. Variations of the arrangement of the layers without affecting the functionality of the layers are well known to those skilled in the art. The laser device 100 is designed such that a semiconductor air interface 242, the surface of the top layer of the top DBR 240, is arranged in a node of a standing wave pattern when driven at the defined electrical input power. Designing the semiconductor air interface 242 in the node of the standing wave pattern of the optical field in the laser cavity or at least sufficiently distant from the anti-node results in case of a degradation of the semiconductor air interface 242 in a decreased laser power emitted by the laser device in a defined solid angle when driven at the defined electrical input power. The degradation of the semiconductor air interface 242 would increase the reflectivity of the top DBR 240 such that less laser power is emitted. Furthermore, due to the functional relation between reflectivity and angle of incidence the "node-position" of the semiconductor air interface maximizes the outcoupling for lower order modes with small emission angle. A degradation of such layer increases the emission angle and therefore decreases the maximum optical power emitted in the defined solid angle.

FIG. 5 shows a cross section of a VCSEL showing an optical resonator embedded in a mesa 120 according to a second embodiment. The semiconductor layer structure is quite similar to the first embodiment shown in FIG. 4. The top DBR 240 is a low doped p-DBR with a doping concentration of about 1E18. The low doped p-DBR in combination with relatively low doped cap/sub-cap structures (<1E19) (not shown) lead to a ring shaped current injection. This favors ring shaped modes and therefore broadens the emission. In addition a protective coating 280 comprising a layer sequence of silicon oxide and silicon nitride layers is provided on top of the top layer of the top DBR 240. The protective coating 280 inhibits degradation of the semiconductor layer structure of the mesas 120. Furthermore, the surface of the top layer of the top DBR 240 is arranged in a node position of the standing wave pattern as described in FIG. 4. A damage of the protective coating 280 with a thickness of half of the emission wavelength and a subsequent degradation of the "new" semiconductor air interface 242 would therefore decrease the maximum optical power emitted in a defined solid angle.

Figure 6:
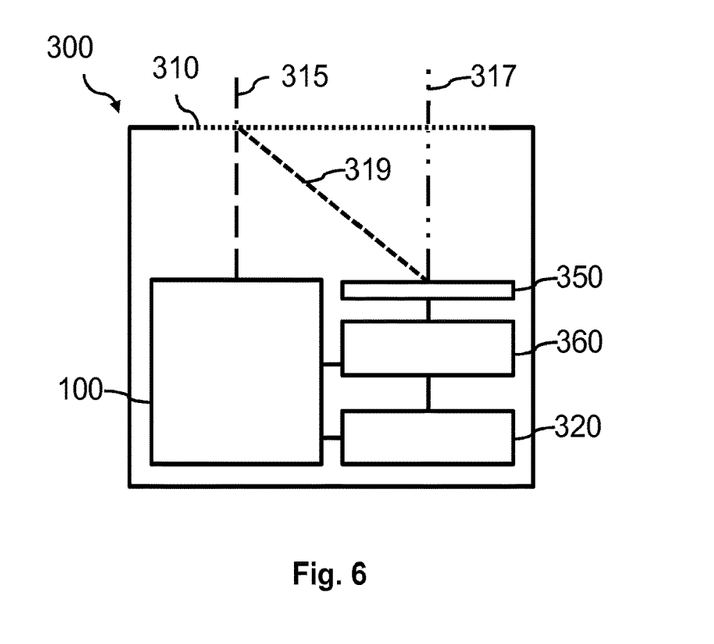
FIG. 6 shows a cross-section of an optical sensor according to a first embodiment

FIG. 6 shows a cross-section of an optical sensor 300 according to a first embodiment. The optical sensor 300 comprises a laser device 100, a transmission window 310 and a driving circuit 320 for electrically driving the laser device 100. The driving circuit 320 is electrically connected to the laser device 100 to supply electrical power to the laser device 100 in a defined way. The driving circuit 320 comprises a memory device for storing data and instructions to operate the driving circuit 320 and a processing unit for executing data and instructions to operate the driving circuit 320. The optical sensor 300 further comprises a photo detector 350 and an evaluator 360. The photo detector 350 is in this case a photo diode but may be any preferably semiconductor device which can be used to detect laser light emitted by the laser device. The photo detector 350 should be as sensitive as possible for the photons emitted by the laser and should have a fast measurement time. A preferred technology are e.g. avalanche photodiodes or even more so called SPADs (single photon avalanche diodes) as well as arrays of the same. The evaluator 360 comprises at least one memory device like a memory chip and at least one processing device like a micro-processor. The evaluator 360 is adapted to receive data from the driving circuit 320 and optionally from the laser device 100 in order to determine a time $t_1$ at which emitted laser light 315 leaves the extended cavity in the form of a laser pulse. The evaluator 360 further determines based on this time $t_1$ and the repetition rate provided by means of the driving circuit 320 whether reflected laser light 317 detected by the photo diode originates from the laser pulse emitted at time $t_1$. A time $t_2$ is recorded if the reflected laser light 317 originates from the laser pulse and the distance to the object which reflected the laser pulse is calculated by means of the time of flight $\Delta t = t_2 - t_1$ and the velocity of the laser pulse c. A small part of the emitted laser light 315 is reflected at the transmission window 310 and used as control signal 319. The control signal 319 is received by means of the photo-detector 350 much earlier than the reflected laser light 317. The evaluator 360 is therefore able to differentiate between reception of control signal 319 and reflected laser light 317. The signal strength of the received control signal 319 is compared by means of the evaluator 360 with a reference signal strength stored in the memory device of the evaluator 360. The evaluator 360 sends a power reduction signal to the driving circuit 320 as soon as the signal strength of the received control signal 319 exceeds a threshold value which is based on the reference signal strength in order to guarantee eye safety of the optical sensor 300.

The time between reception of control signal 319 and reflected laser light 317 may be rather short. It may thus be favorable to use a separate control signal 319 independent from the emitted laser light 315. The separate control signal 319 may be a very short laser pulse emitted between two laser pulses of the emitted laser light 315. Furthermore, it may be favorable to implement a feedback structure in transmission window 310 such that the signal strength of control signal 319 is sufficiently high. The feedback structure may, for example, be a small piece of the surface of the transmission window 310 which is inclined with respect to the rest of the surface of the transmission window 310. Position and inclination angle are chosen such that the control signal 319 is directed to the photo-detector 350.

Figure 7:
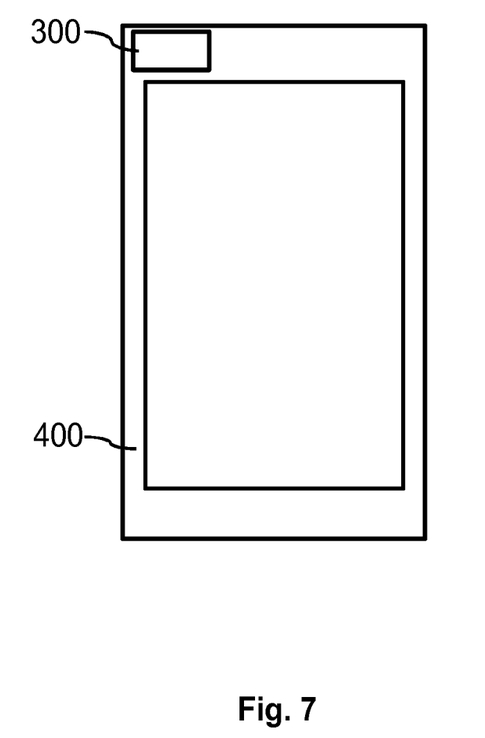
FIG. 7 shows a principal sketch of a mobile device comprising a optical sensor

FIG. 7 shows a principal sketch of a mobile communication device 400 comprising an optical sensor 300. The optical sensor 300 can, for example, be used in combination with a software application running on the mobile communication device 400. The software application may use the optical sensor 300 for sensing applications. Such sensing applications may be time of flight measurements for distance detection, camera autofocus, 3-D imaging of a scene or a gesture based user interface.

Figure 8:
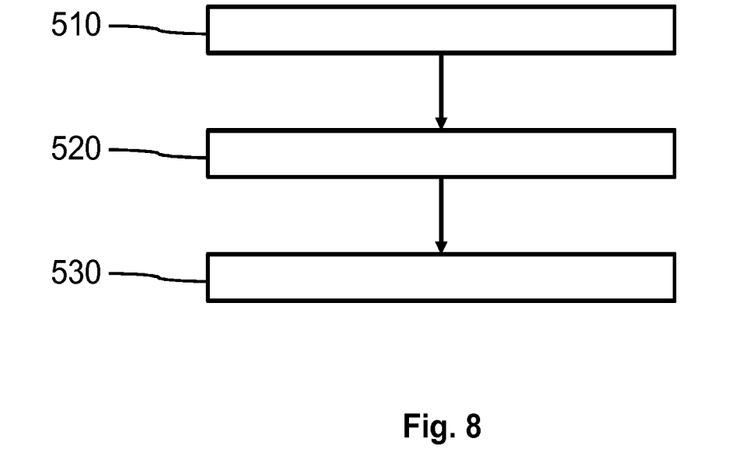
FIG. 8 shows a principal sketch of a method of manufacturing the laser device In the Figures, like numbers refer to like objects throughout. Objects in the Figures are not necessarily drawn to scale.

FIG. 8 shows a principal sketch of a method of manufacturing the laser device 100. In step 510 are between two and six mesas provided on one semiconductor chip 110. The mesas 120 are electrically connected in parallel in step 520 such that the mesas 120 emit laser light at the same time if a defined electrical input power is provided to the mesas 120. The laser device 100 is adapted in step 530 such that degradation of at least one mesa 120 results in a decreased laser power emitted by the laser device when driven at the defined electrical input power such that eye safety of the laser device is maintained. The laser device 100 may, for example, be adapted by providing the semiconductor air interface 242 in a node of the standing wave pattern in the optical resonator when driven at the defined electrical input power.

It is a basic idea of the present invention to provide a laser device 100 comprising between two and six mesas 120, wherein the laser device 100 is adapted such that eye safety of the laser device 100 is guaranteed during life time of the laser device 100. Eye safety may be guaranteed by designing the semiconductor structure or more general the layer structure of the mesas 120 of the laser device 100 in a way that degradation of one or more layer of the layer structure results in a reduction of the maximum optical power emitted in a defined solid angle. Alternatively or in addition, the electrical input power supplied to the laser device 100 may be controlled and adapted depending on the emitted optical power such that safety limits are not exceeded.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS

100 laser device
110 semiconductor chip
120 mesa
125 laser facet
131 first contact area
132 second contact area
135 isolation layer
140 trench
160 bonding area
210 bottom electrode
220 ring electrode
230 bottom DBR
240 top DBR
250 confinement layer
260 active layer
270 substrate
280 protective coating
300 optical sensor
310 transmission window
315 emitted laser light
317 reflected laser light
319 control signal
320 driving circuit
350 photo-detector
360 evaluator
400 mobile communication device
510 step of providing mesas
520 step of electrically connecting the mesas
530 step of adapting the laser device

The invention claimed is:

1. A laser device comprising:
a substrate of a single semiconductor chip; and
at least two mesas and fewer than seven mesas provided on a surface of the substrate of the semiconductor chip,
wherein each of the mesas comprise an optical resonator of a Vertical Cavity Surface Emitting Laser, wherein each optical resonator comprises:
a bottom distributed Bragg resonator (DBR) disposed on the substrate,
an active layer disposed on the bottom DBR, and
a top DBR disposed on the active layer,
wherein a reflectivity of the top DBR is less than a reflectivity of the bottom DBR,
wherein the Vertical Cavity Surface Emitting Laser is arranged to emit laser light of an emission wavelength,
wherein the mesas are electrically connected to each other,
wherein the laser device is arranged such that degradation of a semiconductor air interface of at least one mesa or a degradation of the at least one mesa which decreases the reflectivity of the top DBR the at least one mesa results in a decreased laser power of the laser light emitted by the Vertical Cavity Surface Emitting Laser in a defined solid angle, wherein the defined solid angle is a solid angle in which maximum laser power is emitted.

2. The laser device according to claim 1,
wherein each mesa comprises a protective coating, and
wherein the protective coating is arranged such that degradation of at least one protective coating results in a decreased laser power emitted by the laser device.

3. The laser device according to claim 1, wherein the semiconductor air interface is arranged in a node of a standing wave pattern when the at least one mesa is driven at a defined electrical input power.

4. The laser device of claim 3, wherein the semiconductor air interface is arranged such that a degradation of the at least one semiconductor air interface reduces an outcoupling of laser light by increasing a reflectivity of the laser device.

5. The laser device according to claim 1, wherein the mesas are arranged to support ring shaped laser modes.

6. The laser device according to claim 5, wherein a semiconductor layer structure of the mesas is arranged such that there is a ring-shaped current injection.

7. The laser device according to claim 5,
wherein each mesa comprises a spatially structured protective coating, and
wherein the spatially structured protective coating supports ring shaped laser modes.

8. The laser device according to claim 1,
wherein each mesa is surrounded by a trench, and
wherein a level of the substrate beyond the trench is at least as high as a laser exit window of the mesa.

9. A laser module comprising the laser device according to claim 1, further comprising a driving circuit for electrically driving the mesas, wherein the driving circuit is arranged to provide a defined electrical input power to the mesas.

10. An optical sensor comprising the laser module according to claim 9.

11. The optical sensor according to claim 10, further comprising:
at least one photo-detector wherein the photo-detector is arranged to receive reflected laser light of a laser pulse emitted by the laser device; and
an evaluator circuit,
wherein the evaluator is arranged to identify the reflected laser light of the laser pulse, wherein the evaluator is arranged to determine a time of flight between a time of reception of the reflected laser light and a time of emission of the corresponding laser pulse.

12. A mobile communication device, the mobile communication device comprising at least one optical sensor according to claim 10.

13. The laser device according to claim 1, wherein the semiconductor air interface is arranged distant from an anti-node of a standing wave pattern of an optical field in a laser cavity of the laser device.

14. The laser device of claim 1, wherein the defined solid angle is defined by an aperture of 7 mm at a distance of 70 mm from the laser device.

15. A method of manufacturing a laser device, the method comprising:
providing between two and six mesas on a substrate of a single semiconductor chip;
electrically connecting the mesas in parallel with each other,
wherein each of the mesas comprise an optical resonator of a Vertical Cavity Surface Emitting Laser, the Vertical Cavity Surface Emitting Laser arranged to emit laser light of an emission wavelength,
wherein each optical resonator comprises:
a bottom distributed Bragg resonator (DBR) disposed on the substrate,
an active layer disposed on the bottom DBR, and
a top DBR disposed on the active layer,
wherein a reflectivity of the top DBR is less than a reflectivity of the bottom DBR,
wherein each mesa comprises a semiconductor air interface; and
arranging the laser device such that degradation of the semiconductor air interface of at least one mesa or a degradation of the at least one mesa which reduces the reflectivity of the top DBR of the at least one mesa results in a decreased laser power of the laser light emitted by the Vertical Cavity Surface Emitting Laser in a defined solid angle, wherein the defined solid angle is a solid angle in which maximum laser power is emitted.

16. The method of claim 15, further comprising:
arranging the semiconductor air interface distant from an anti-node of a standing wave pattern of an optical field in a laser cavity of the laser device, wherein the semiconductor air interface is arranged such that a degradation of the semiconductor air interface reduces an outcoupling of laser light by increasing a reflectivity of the laser device.

17. The method of claim 15, wherein the defined solid angle is defined by an aperture of 7 mm at a distance of 70 mm from the laser device.

* * * * *